United States Patent

Huang et al.

[11] Patent Number: 6,045,963
[45] Date of Patent: Apr. 4, 2000

[54] NEGATIVE-WORKING DRY PLANOGRAPHIC PRINTING PLATE

[75] Inventors: Jianbing Huang, Wood-Ridge, N.J.; Richard Goodman, Briarcliff Manor, N.Y.; Thi Do, West Orange, N.J.

[73] Assignee: Kodak Polychrome Graphics LLC, Norwalk, Conn.

[21] Appl. No.: 09/040,163

[22] Filed: Mar. 17, 1998

[51] Int. Cl.[7] .............................. G03F 7/023; G03F 7/30
[52] U.S. Cl. ..................... 430/166; 430/165; 430/303; 101/452; 101/467
[58] Field of Search .................................. 430/166, 303, 430/165; 101/452, 467

[56] References Cited

U.S. PATENT DOCUMENTS

| | | | |
|---|---|---|---|
| 2,766,118 | 10/1956 | Sus et al. | 95/7 |
| 2,767,092 | 10/1956 | Schmidt et al. | 95/7 |
| 2,772,972 | 12/1956 | Herrick, Jr. et al. | 95/33 |
| 2,859,112 | 11/1958 | Sus et al. | 96/91 |
| 2,907,665 | 10/1959 | Fraher et al. | 106/49 |
| 3,046,111 | 7/1962 | Schmidt et al. | 96/33 |
| 3,046,115 | 7/1962 | Schmidt et al. | 96/33 |
| 3,046,118 | 7/1962 | Schmidt et al. | 96/33 |
| 3,046,119 | 7/1962 | Sus et al. | 96/33 |
| 3,046,121 | 7/1962 | Schmidt | 96/33 |
| 3,046,122 | 7/1962 | Sus et al. | 96/33 |
| 3,046,123 | 7/1962 | Sus et al. | 96/33 |
| 3,061,430 | 10/1962 | Uhlig et al. | 96/33 |
| 3,102,809 | 9/1963 | Endermann et al. | 96/33 |
| 3,106,465 | 10/1963 | Neugebaner et al. | 96/33 |
| 3,511,178 | 5/1970 | Curtin | 101/450 |
| 3,635,709 | 1/1972 | Kobayashi | 96/33 |
| 3,647,443 | 3/1972 | Rauner et al. | 96/33 |
| 3,933,495 | 1/1976 | Kondo et al. | 96/33 |
| 4,184,006 | 1/1980 | Hockemeyer et al. | 428/447 |
| 4,342,820 | 8/1982 | Kinashi et al. | 430/11 |
| 4,358,522 | 11/1982 | Fujita et al. | 430/166 |
| 4,842,990 | 6/1989 | Herrmann et al. | 430/272 |
| 4,853,313 | 8/1989 | Mori et al. | 430/156 |
| 5,631,119 | 5/1997 | Shinozaki et al. | 430/326 |
| 5,866,294 | 2/1999 | Oguni et al. | 430/166 |
| 5,919,600 | 7/1999 | Huang et al. | 430/272.1 |

FOREIGN PATENT DOCUMENTS

| | | | |
|---|---|---|---|
| 0 763 780 A2 | 3/1997 | European Pat. Off. | G03F 7/075 |
| 62/161154 | 7/1987 | Japan . | |
| 63/074064 | 4/1998 | Japan . | |

*Primary Examiner*—John S. Chu
*Attorney, Agent, or Firm*—Ratner & Prestia

[57] ABSTRACT

A negative waterless plate contains a sheet substrate; a radiation sensitive imaging layer composed of a diazido naphthaquinone ester or amide compound, such as diazido naphthaquinone sulfonate of a phenolic resin, and a polyurethane prepared by reacting a di-isocyanate and a diol; and a silicone layer. The planographic printing plate is imagewise exposed to actinic radiation through a negative original to form exposed areas of the imaged layer which are soluble or dispersible in a developer liquid. After imaging exposure, the developer liquid is applied which penetrates the silicone layer and dissolves the areas exposed to the radiation. The coating areas not exposed by the radiation remain intact. During this development procedure, areas of the silicone layer overlying the exposed areas are removed along with the underlying soluble areas to produce an imaged planographic printing plate having uncovered ink receptive areas and complimentary ink repellent areas of the silicone layer. In use, the developed plate is mounted on a dry planographic printing press containing only a lithographic ink; and used to print a positive image on conventional print stock.

41 Claims, No Drawings

NEGATIVE-WORKING DRY PLANOGRAPHIC PRINTING PLATE

BACKGROUND OF THE INVENTION

1. Field of the Invention

This invention relates to planographic printing plates. More particularly, this invention relates to negative-working, waterless planographic printing plates and their use in lithographic printing.

2. Description of Related Art

A negative-working, dry or waterless, planographic printing plate is one which is imaged with a negative original and used in lithographic printing that does not require dampening with water. A typical plate of this type consists of (1) a silicone layer, (2) a positive working radiation sensitive imaging layer, e.g., a photosolubilizable layer, and (3) an ink receptive substrate. After exposure to actinic radiation, typically ultraviolet (UV) radiation, through a negative original, a developer penetrates the silicone layer and dissolves the areas of the radiation sensitive coating which were exposed to the radiation and those areas with the overlying areas of the silicone layer are removed from the ink receptive surface. The coatings in areas not exposed to radiation remain intact and form ink repelling areas of the plate.

Such a negative-working, dry planographic printing plate was first disclosed in U.S. Pat. No. 3,511,178 in which the radiation sensitive layer consists of a tungsten-diazonium complex. However such sensitive layers were found to suffer from poor thermal stability. U.S. Pat. No. 3,933,495 discloses a waterless plate whose light-solublizable sublayer comprises a reaction product of a hydroxy-benzophenone compound with the condensation product of p-diazo diphenylamine and formadehyde. This composition becomes more soluble in cyclohexanone upon exposure to UV light. Among other limitations, the obnoxious odor and toxicity of cyclohexanone limit commercialization of this technology.

Although naphthaquinone diazides have long been known for use in light-solubilizable compositions, their use in the light-solublizable sublayer for negative waterless plates was not realized until 1982, when U.S. Pat. No. 4,342,820 disclosed a crosslinked phenolic composition functionalized with naphthaquinone diazide species. Since the binder resin was crosslinked, naphthaquinone diazide functionality provided photo-induced swellablity instead of photo-induced solubility. More recently, U.S. Pat. No. 4,358,522 discloses plates in which the radiation layer uses 1-naphthaquinone-2-diazide-5-sulfonate of a Novolac resin that must have 44–65% esterification of the phenolic hydroxy groups and must contain less than 20% ethanol soluble fraction. This type of diazide resin requires special synthesis and purification efforts and, therefore, is expensive to prepare. In both U.S. Pat. Nos. 4,342,820 and 4,358,522, an adhesion promoter such as γ-aminopropyltriethoxy silane between the silicone top layer and the radiation sensitive sublayer is essentially required and adds to the manufacturing costs. While the adhesion promoter is effective for condensation-cured silicone elastomer compositions, it is not as effective for addition-cured silicone elastomer compositions. Addition-curing and condensation curing compositions are two primary crosslinking technologies used in silicone elastomer preparation. Addition-curing involves addition of Si—H groups to vinyl groups, whereas condensation curing involves reaction of Si—OH terminated siloxane polymers with silane crosslinkers containing silicone atoms attached to a plurality of OH groups. Such silane crosslinkers usually are formed in situ via hydrolysis of acetoxy or alkoxy silanes.

U.S. Pat. No. 4,842,990 discloses a waterless planographic printing plate with an amorphous silicic acid interlayer in which solubilization is light induced by acid-catalyzed hydrolysis. This type of plate typically requires an extra step in processing, i.e., post-exposure heating. Due to non-uniformity of oven temperature, such post-exposure heating often limits consistent image reproduction.

SUMMARY OF THE INVENTION

The foregoing problems of the disclosed plates are effectively solved by the printing plate of this invention which is a dry planographic printing plate comprising, in the order given:

A) a sheet substrate;
B) a radiation sensitive imaging layer consisting essentially of a diazido naphthaquinone ester or amide compound, and a thermoplastic polyurethane; and
C) a silicone layer comprised of a crosslinked silicone polymer.

An added embodiment of this invention is a method for imaging a planographic printing plate comprising the steps, in the order given:

I) providing a planographic printing plate comprising, in the order given:
A) a sheet substrate;
B) a radiation sensitive imaging layer consisting essentially of a diazido naphthaquinone ester or amide compound, and a thermoplastic polyurethane; and
C) a silicone layer comprised of a crosslinked silicone polymer;

II) imagewise exposing the radiation sensitive imaging layer to actinic radiation to form an imaged layer having exposed areas and complimentary unexposed areas, wherein only the exposed areas of the imaged layer are soluble or dispersible in a developer liquid; and III) applying the developer liquid to the planographic printing plate to remove the exposed areas along with overlying areas of the silicone layer to produce an imaged planographic printing plate having uncovered ink receptive areas and complimentary ink repellent areas of the silicone layer.

A further embodiment of this invention is a method for planographic printing consisting essentially of the steps, in the order given:

I) providing a dry planographic printing plate comprising in the order given:
A) a sheet substrate;
B) a radiation sensitive imaging layer consisting essentially of a diazido naphthaquinone ester or amide compound, and a thermoplastic polyurethane; and
C) a silicone layer comprised of a crosslinked silicone polymer;

II) imagewise exposing the radiation sensitive imaging layer to actinic radiation to form an imaged layer having exposed areas and complimentary unexposed areas, wherein only the exposed areas of the imaged layer are soluble or dispersible in a developer liquid; and III) applying the developer liquid to the planographic printing plate to remove the exposed areas along with overlying areas of the silicone layer to produce an imaged planographic printing plate having uncovered ink receptive areas and complimentary ink repellent areas of the silicone layer;

IV) mounting the imaged planographic printing plate on a planographic printing press which is free of a fountain solution and contains a lithographic ink; and V) printing print stock to produce printed stock therefrom.

DETAILED DESCRIPTION OF THE INVENTION

The present invention relates to a novel negative waterless plate, which may be imaged with a negative original and used in lithographic printing that does not require dampening water. The dry planographic printing plate of this invention has as its essential components: a sheet substrate; a radiation sensitive imaging layer which consists essentially of a diazido naphthaquinone ester or amide compound, and a thermoplastic polyurethane, such as a polyurethane prepared by reacting a di-isocyanate and a diol; and a silicone layer. In the imaging method of this invention, the planographic printing plate is imagewise exposed to actinic radiation through a negative original to form an imaged layer in which only the exposed areas of the imaged layer are soluble or dispersible in a developer liquid. After exposure to actinic radiation through the negative original, the developer liquid is applied which penetrates the silicone layer and dissolves the radiation sensitive coating in areas exposed to the radiation. The coating areas not exposed by the radiation remain intact. During this development procedure, areas of the silicone layer overlying the exposed areas are removed along with the underlying soluble areas to produce an imaged planographic printing plate having uncovered ink receptive areas and complimentary ink repellent areas of the silicone layer. In use, the developed plate is mounted on a dry planographic printing press containing only a lithographic ink; and used to print a positive image on conventional print stock. Typically the lithographic ink used is an oil based ink.

Lithographic Printing Plate

The planographic printing plate of this invention has as its essential components a sheet substrate; a radiation sensitive imaging layer consisting essentially of a diazido naphthaquinone ester or amide compound, and a thermoplastic polyurethane, such as a polyurethane prepared by reacting a di-isocyanate and a diol; and a silicone layer. In addition, the plate may contain one or more ancillary layers to improve interlayer adhesion, to reduce halation effects, to improve printing surface characteristics, and the like.

A. Sheet Substrate:

Substrates which may be used in the planographic plate of this invention may be any sheet material conventionally used to prepare lithographic printing plates. Suitable substrates include metals such as aluminum sheets; paper; paper coated on one or both sides with an α-olefin polymer such as polyethylene; films such as cellulose acetate film, polyvinyl acetal film, polystyrene film polypropylene film, polyester film such as polyethylene terephthalate film, polyamide film, polyimide film, nitrocellulose film, polycarbonate film, polyvinylchloride film; composite films such as polyester, polypropylene or polystyrene film coated with polyethylene film; metalized paper or films; metal/paper laminates; and the like. Such substrates may contain an antihalation compound or sub coatings.

A preferred substrate is an aluminum sheet. The surface of the aluminum sheet may be treated with metal finishing techniques known in the art including brushing roughening, electrochemical roughening, chemical roughening, anodizing, and silicate sealing and the like. If the surface is roughened, the average roughness Ra is preferably in the range from 0.1 to 0.8 $\mu$m, and more preferably in the range from 0.1 to 0.4 $\mu$m. The preferred thickness of the aluminum sheet is in the range from about 0.005 inch to about 0.020 inch.

The surface of plastic films may be treated using the surface treatment techniques known in the art to improve adhesion between the substrate and organic coatings.

B. Imaging Layer:

The positive working radiation sensitive imaging layer of the present invention contains as essential ingredients a thermoplastic polyurethane and a 1,2-diazido-naphthaquinone compound. The thermoplastic polyurethane typically is a linear polymer, although the polymer chain may contain branching. As used herein the term "thermoplastic" is intended to mean a polymer or resin which is substantially free of polymeric networks formed by crosslinking. Preferably, the thermoplastic polyurethane is prepared by reacting a di-isocyanate and a diol. The 1,2-diazido-naphthaquinone compound preferably is a diazido naphthaquinone sulfonate of a phenolic material. Ancillary ingredients that may be added to the radiation sensitive layer include colorants, leuco dyes, surfactants, and acid generators. Such ancillary ingredients are useful for adjusting coating appearances, for quality control during plate manufacturing, and for image inspections before and after development. The imaging layer may also contain an ancillary co-binder such as a phenolic resin, to enhance developability in some developer solutions.

Polyurethanes used in this invention preferably contain allyl functionality. The allyl functional polyurethane may be prepared by reacting a diisocyanate with an allyl functional diol. Mixtures of different diisocyanate and mixtures of different diol may be used. If a mixture of different diols is used, at least one of the diols in the mixtures should contain an allyl group. A simple and commercially available diol with an allyl group is 3-allyloxy-1,2-propanediol. Other diols which may be used with allyl-diols include ethylene glycol, polyethylene glycol, propylene glycol, polypropylene glycol, and neopentyl glycol. Preferably the allyl functional diol constitutes more than 70%, and more preferably more than 90% of the diol mixture.

Both aromatic and aliphatic diisocynates may be used, with the aromatic diisocynates being preferred. Examples of aromatic diisocyanates include 2,4-tolylene diisocyanate, 2,6-tolylene diisocyanate, p-xylene diisocynate, m-xylene diisocyanate, 4,4'-diphenylmethane diisocyanate, 1,5-naphthalene diisocyanate, 3,3'-dimethylbiphenyl-4,4'-diisocyanate. Examples of aliphatic diisocyanates are hexamethylene diisocyanate, trimethylhexamethylene diisocyanate, isophorone diisocyanate, 4-4'-methylenebis (cyclohexyl isocyanate), methylcyclohexane-2,4- (or 2,6)-diisocyanate, and 1,3-bis(isocyanatomethyl) cyclohexane.

The 1,2-diazido-naphthaquinone compound is a 1,2-diazido-naphthaquinone ester or amide of a polyhydroxy compound, or a polyamino compound. Examples of 1,2-diazido-naphthaquinone compounds which may be used in this invention include the o-naphthoquinone diazide compounds disclosed in U.S. Pat. Nos. 2,766,118; 2,767,092; 2,772,972; 2,859,112; 2,907665; 3,046,111; 3,046,115; 3,046,118; 3,046,119; 3,046,121; 3,046,122; 3,046,123; 3,061,430; 3,102,809; 3,106,465; 3,635,709; and 3,647,443. Among these, preferred are o-naphthoquinone-diazidosulfonates or o-naphthoquinone-diazidocarboxylates of aromatic hydroxyl compounds; o-naphthoquinonediazido-sulfonic acid amides or o-naphthoquinonediazidocarboxylic acid amides of aromatic amine compounds, for instance esters of naphthoquinone-1,2-diazido-sulfonic acid with polyhydroxyl phenyl; esters of naphthoquinone-1,2-diazido-4-sulfonic acid or naphthoquinone-1,2-diazido-5-sulfonic acid with pyrogallol/acetone resins; esters of naphthoquinone-1, 2-diazidosulfonic acid with Novolac type phenol/formaldehyde resins or Novolac type cresol/formaldehyde resins; amides of poly(p-aminostyrene) and naphthoquinone-1,2-diazido4-sulfonic acid or naphthoquinone-1,2-diazido-5-sulfonic acid; esters of of poly(p-hydroxystyrene) and naphthoquinone-1,2-diazido-5- sulfonic acid; and the like. Preferably the 1,2-diazidonaphthaquinone compound is a 1,2-diazido-naphthaquinone sulfonate of the phenolic material. Typically such sulfonate derivatives are the reaction product of the phenolic material with one or more of 1,2-diazido-naphthaquinone-4-sulfonyl chloride or with one or more of 1,2-diazidonaphthaquinone-5-sulfonyl chloride. The phenolic material is an aromatic compound or resin bearing a plurality of phenolic hydroxy groups. Useful phenolic materials of this type include Novolac resins and the condensates of acetone with pyrogallol. A preferred example of 1,2-diazidonaphthaquinone compound is RP2, which is the reaction product between a Novolac resin with 1,2-diazidonaphthaquinone-4-sulfonyl chloride, and is commercially available from PCAS, France.

The polyurethane and 1,2-diazidonaphthaquinone compound, along with optional ingredients, may be dissolved in a suitable solvent system for film casting. The solvent system may contain one or more of the following common organic solvents: 2-butanone, methanol, ethanol, 1-propanol, 2-propanol, 1-butanol, methyl isobutyl ketone, propylene glycol methyl ether, ethylene glycol methyl ether, ethylene glycol ethyl ether, toluene, and xylenes. The radiation sensitive layer may be cast using the film formation methods known in the art. After proper drying, the coating weight of the radiation sensitive layer preferably is in the range of about 0.2 to about 5.0 g/m$^2$, and more preferably in the range from about 0.7 to about 2.5 g/m$^2$.

C. Silicone Layer:

The silicone layer of the present invention is a crosslinked polydiorganosiloxane comprising the following repeating units:

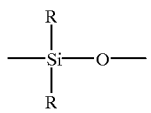

wherein R each individually represents a monovalent group such as an alkyl, an aryl or an alkenyl group or a combination thereof. R each individually may also contain functional fragments such as hydroxyl, halogen, amino, alkoxy, aryloxy, (meth)acryloxy, thiol or combinations thereof. Most preferably R is methyl, and should represent the majority if a mixture of different R groups is used. The silicone layer may optionally contain pigments and fillers such as silica, calcium carbonate, and titanium oxide. Adhesion promoters may also be added to the coating to improve silicone layer formation.

Polydiorganosiloxane network may be formed using known crosslinking reactions including condensation between silanol and acyloxy or alkoxy silanes, addition of hydrosilane to alkenyl groups, and photo-initiated polymerization of (meth)acrylate or epoxy groups. Among these crosslinking methods, the condensation and addition methods are preferred, with the addition method being the most preferred.

For condensation crosslinking, silanol terminated diorganosiloxane polymer may be reacted with polyacyloxy or polyalkoxy silane crosslinkers in the presence of a suitable catalyst. This type of reaction is accelerated both by heat and moisture. For better pot-life during manufacturing, a silicone network may be formed via the self condensation of polydiorganosiloxane with trialkoxysilyl groups on both ends as taught in European Patent Application EP 0 763 780 A2 the disclosure of which is incorporated herein by reference. Suitable catalysts for this type of condensation are organic carboxylic acid salts of tin, zinc and other multivalent metals and are well known in the art. Adhesion promoters may also be included in this type silicone coating formulation. Preferred adhesion promoters are aminosilanes, such as represented by the general formula

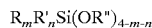

$R_m R'_n Si(OR'')_{4-m-n}$ where R is unsubstituted or monosubstituted amino-alkyl, R' and R" are each alkyl or aryl, m is 1 or 2 and n is 0 or 1, m+n being equal to 1 or 2. Specific examples of such aminosilanes are γ-aminopropyltriethoxy silane and γ-[N-(2-aminoethyl)-amino]propyl trimethoxy silane.

Polydiorganosiloxane crosslinked via addition reaction between hydrosilane and alkenyl groups may be prepared from a vinyl functional polydiorganosiloxane and methyl hydrosiloxane homopolymer or copolymer in the presence of a suitable catalyst. The alkenyl groups in the siloxane polymer may be randomly distributed along the polymer chain, or located at the chain ends. Known addition catalysts may be used, but platinum compounds are particularly preferred. Examples of platinum compounds useful in this invention are elemental platinum, platinum chloride, chloroplatinic acid and platinums coordinated with olefins. To improve pot-life, volatile inhibitors such as ketones, alcohols and alkynes may be used. Particularly preferred are alkynes such as those disclosed in U.S. Pat. No. 4,184,006 the disclosure of which is incorporated herein by reference. Specific examples of such alkynes are 2-methyl-3-butyne-2-ol, ethynylcyclohexanol, 2-butyne, 2-methyl-but-1-en-3-yne, and phenyl acetylene.

Organic solvents may be used to facilitate film formation of the silicone layer. Suitable solvents include aliphatic and aromatic hydrocarbons, ketones, and esters. Specific examples of useful solvents are hexane, heptane, toluene, xylene, 2-butanone, and amyl acetate. The amount of solvents used primarily depends upon molecular weights of silicone starting materials, coating thickness and the coating application technique. Coating methods for applying silicone coatings are known in the art. Preferred coating methods for use in this invention include whirl coating, wire-wound bar coating, direct gravure coating, gravure-offset coating, liquid curtain coating, slit-extrusion coating, meniscus coating and the like. The coating weight of the silicone layer may be in the range between about 0.2 to about 10 g/m$^2$, and preferably in the range between about 1.0 to about 3.0 g/m$^2$.

D. Ancillary Layers:

The planographic printing plate of this invention may contain one or more ancillary layers to improve interlayer adhesion, to reduce halation effects, to improve printing surface characteristics, and the like. Optional layers that may be added to modify the essential plate construction include a protective layer laminated on top of silicone layer, an adhesion promotion layer between silicone and the radiation sensitive layer, and a primer layer between the radiation sensitive layer and the substrate.

An optional primer layer may be inserted between the radiation-sensitive layer and the substrate. The primer layer may perform one or several functions including ink-receptivity during printing, dye receptivity if the developed plate needs to be dyed to enhance visual image contrast, and adhesion promotion. The primer layer may be thermoset coating, or, a UV curable coating. It may also be a thermoplastic coating provided that the primer coating is not soluble in the application solvents used in casting the radiation-sensitive layer. Examples of thermoset coatings include polyester-melamine coatings, acrylic-melamine coatings, epoxy coatings, and polyisocyanate coatings. An example of thermoplastic coating is polyvinyl alcohol. UV curable coatings may consist of free radical polymerizable coatings, cationic crosslinkable coatings catalyzed by photo generated acid, and diazo resin with suitable binders.

An optional adhesion promotion layer may be inserted between the silicone top layer and the radiation-sensitive sublayer. Preferred adhesion promoters are aminosilanes, said aminosilane being represented by the general formula

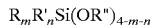

$$R_m R'_n Si(OR'')_{4-m-n}$$

where R is unsubstituted or mono-substituted amino-alkyl, R' and R" are each alkyl or aryl, m is 1 or 2 and n is 0 or 1, m+n being equal to 1 or 2. Specific examples of such aminosilanes are γ-aminopropyltriethoxy silane and γ-[N-(2-aminoethyl)amino]propyl trimethoxy silane.

An optional protective layer may be laminated on top of silicone layer to protect the silicone surface during storage and handling. Typically the protective layer is a thin polymeric film including polyesters such as polyethylene terephthalate, polyolefins such as polyethylene and polypropylene, and the like. The protective layer is designed to be easily removed without damaging the silicone layer surface either prior to or during processing.

Method of Imaging

The dry planographic plate of this invention is imaged by the method comprising the following steps. First a planographic printing plate is provided which consists essentially of, in the order given: a sheet substrate; a radiation sensitive imaging layer consisting essentially of a diazido naphthaquinone sulfonate of a phenolic resin, and a polyurethane prepared by reacting a di-isocyanate and a diol; and a silicone layer. Next the radiation sensitive imaging layer is imagewise exposed to actinic radiation to form an imaged layer having exposed areas and complimentary unexposed areas, wherein only the exposed areas of the imaged layer are soluble or dispersible in a developer liquid. Finally the developer liquid is applied to the planographic printing plate to remove the exposed areas along with overlying areas of the silicone layer to produce an imaged planographic printing plate having uncovered ink receptive areas and complimentary ink repellent areas of the silicone layer.

The dry, planographic printing plate and its methods of preparation have already been described above. The dry, planographic printing plate may be imagewise exposed using any conventional contact or projection imaging apparatus containing a source of actinic radiation such as ultraviolet radiation. Typically, a contact negative of the desired image is placed in contact with the silicone layer of the plate and the plate/negative combination is exposed to actinic radiation. In this operation the radiation sensitive imaging layer is imagewise exposed to actinic radiation passing through the contact negative film element and the silicone layer. Alternatively the radiation sensitive imaging layer may be imagewise exposed to actinic radiation passing through projection negative film element. Although the imaging layer is typically exposed through the silicone layer, the imaging layer may also be imaged through the sheet substrate in those instances when the sheet substrate is composed of a material which is transparent to actinic radiation, e.g., polyethylene terephthalate. When the silicone surface of the planographic printing plate is protected by a protective layer which is transparent to actinic radiation, the protective layer may remain in place during imaging exposure, or it may be removed. In either event, the protective layer typically is removed prior to development.

When the radiation sensitive layer is spectrally sensitized to an appropriate wavelength, the negative film element may be dispensed with and the imaging layer may be imaged using "direct-to-plate" imaging systems. Direct-to-plate systems utilize digitized information, as stored on a computer disk or computer tape, which is intended to be printed. The bits of information in a digitized record correspond to the image elements or pixels of the image to be printed. The pixel record is used to control an exposure device which may, for example, take the form of a modulated laser beam. The position of the exposure beam, in turn, may be controlled by a rotating drum, a leadscrew, or a turning mirror. The exposure beam is then turned on or off in correspondence with the pixels to be printed. The exposing beam is focused onto the imaging layer of the unexposed plate. During the writing operation, the plate to be exposed is placed in the retaining mechanism of the writing device and the write laser beam is scanned across the plate and digitally modulated to generate an image on the surface of the lithographic plate.

When areas of the imaging layer are exposed to actinic radiation, the photo reaction products produced therein selectively are soluble or dispersible in a developer liquid. The developer liquid may be any liquid or solution which can both penetrate the silicone layer and selectively dissolve or disperse the photoreaction products without substantially affecting the unexposed areas of the radiation sensitive layer. Preferred developer solutions are those that contain polypropylene glycol ethers. A more preferred developer solution is tripropylene glycol n-butyl ether. The developer liquid may be diluted with a non-developing liquid. As used herein, the term non-developing liquid is intended to mean any liquid which does not penetrate the silicone layer and/or does not selectively dissolve or disperse the photoreaction products. Non-developing liquids include liquids such as polypropylene glycol and aliphatic hydrocarbon solvents. Specific aliphatic hydrocarbon solvents are heptane and isoPar series solvents from Exon Chemical Company. The non-developing liquid should be present in the developer solution in no more than 50 wt %.

Typically the developer liquid is applied to the planographic printing plate by rubbing or wiping the silicone layer with an applicator containing the developer liquid. In the development operation the developer liquid penetrates the silicone layer and solubilizes or disperses the imaged areas of the imaging layer and the wiping action physically removes the solubilized areas along with overlying areas of the silicone layer. Alternatively the imaged planographic printing plate may be brushed with the developer liquid or the developer liquid may be applied to the plate by spraying the silicone layer with sufficient force to remove the solubilized areas. In either instance a developed printing plate is produced which has uncovered areas which ink receptive and complimentary areas of the silicone layer, not exposed to actinic radiation, which effectively are ink repellent. After development is complete, the developer liquid remaining on the plate typically is removed with a non-developing cleaning liquid to avoid damage to the silicone layer in the non-exposed areas. Suitable cleaning liquids include aqueous surfactant solutions, polypropylene glycols and aliphatic hydrocarbon solvents.

In an alternative development step, the latent images formed after UV exposure may be developed by first soaking the exposed plate in a developer to weaken the adhesion between the silicone top layer and the radiation sensitive coating, and then rubbing the exposed surface with a non-developer liquid to remove loosened silicone areas. Suitable developer liquids for this method are mixtures of ethanol and hydrocarbon solvents such as IsoPar E from Exxon Chemical Company. The ethanol content is preferably in the range from about 50 to 100% by weight. Soaking time is preferably in the range from about 30 seconds to about 120 seconds. Useful non-developer liquids for removing loosened silicone areas include hydrocarbons, mineral oils, and vegetable oils. Colorants may be added to the non-developer liquid to enhance image contrast after silicone is removed.

Method of Printing

The litho plates of this invention may be used in a method for lithographic printing which consists essentially of the following steps. First a planographic printing plate is provided which consists essentially of, in the order given: a sheet substrate; a radiation sensitive imaging layer consisting essentially of a diazido naphthaquinone sulfonate of a phenolic resin, and a polyurethane prepared by reacting a di-isocyanate and a diol; and a silicone layer. Next the radiation sensitive imaging layer is imagewise exposed to actinic radiation to form an imaged layer having exposed areas and complimentary unexposed areas, wherein only the exposed areas of the imaged layer are soluble or dispersible in a developer liquid. Next the developer liquid is applied to the planographic printing plate to remove the exposed areas along with overlying areas of the silicone layer to produce an imaged planographic printing plate having uncovered ink receptive areas and complimentary ink repellent areas of the silicone layer. Next the imaged planographic printing plate is mounted on a dry planographic printing press containing only a conventional lithographic ink, e.g., an oil based ink; and finally print stock is printed to produce printed stock therefrom.

The dry, planographic printing plate and its methods of preparation, imaging and development have already been described above. The developed planographic printing plate of this invention is used in a "dry" planographic printing operation that requires no dampening fountain solution used in conventional planographic printing. In this operation, the developed plate is mounted on the planographic printing press containing only a lithographic ink (an oil based ink) and an image corresponding to the original is printed on print stock such as paper, cardboard, plastic film, metal sheeting, and the like. This "positive" image corresponds to the inked portions of the developed printing plate of this invention. Such planographic printing presses include sheet-fed and web-fed presses of conventional design used without fountain solutions. Typically such presses are fitted with temperature control devices.

The negative-working, dry planographic printing plates of this invention will now be illustrated by the following examples but is not intended to be limited thereby.

EXAMPLE 1

A linear polyurethane was prepared by reacting 4,4'-diphenylmethane diisocyanate and 3-allyloxypropane-1,2-diol by the following procedure. In a round-bottom glass flask equipped with a condenser and a mechanical stirrer, 98.2 gram (0.393 mol) 4,4'-diphenylmethane diisocyanate (mol. wt: 250) was dispersed in 347 gram dry 2-butanone at room temperature (ca. 25° C.) until a uniform milky dispersion was obtained. Then 51.8 gram (0.393 mol) 3-allyloxypropane-1,2-diol was added to the flask at a rate such that the temperature rise due to the exotherm of the reaction was controlled below 15 degrees, viz., the temperature of the mixture was maintained below 40° C. The mixture was stirred without external heating for two hours. Then 3 gram 5% dibutyl tin dilaurate solution in dry 2-butanone was added also at a rate such that temperature rise due to exotherm of the reaction was controlled below 15 degrees, viz., the temperature of the mixture was maintained below 40° C. The mixture was stirred without external heating for two additional hours. Finally, the reaction was pushed to completion at 60° C. Completion of the reaction was indicated by the disappearance of NCO absorption bands in infrared spectra. After filtration, the product solution, hereafter identified as Polyurethane Solution (I), contained 30% polyurethane resin and was slightly hazy.

The following radiation sensitive coating solution was applied to an electrochemically roughened aluminum sheet:

| Component | Parts by weight |
| --- | --- |
| RP2[1] | 1.25 |
| Polyurethane Solution (I) | 3.75 |
| 2-butanone | 100.00 |

[1]RP2 is a 1,2-diazidonaphthaquinone-4-sulfonate of a Novolac resin available from PCAS, France.

The above coating was applied by a whirler coater spinning at 80 rpm followed by drying at 95° C. for 5 min. Onto the dried radiation sensitive coating formed, a silicone coating solution was applied by a whirler coater also spinning at 80 rpm. The silicone coating solution had the following composition:

| Component | Parts by weight |
| --- | --- |
| PS 225[2] | 2.0 |
| SL 6020[3] | 0.2 |
| SL 6040[4] | 0.06 |
| PC 075[5] | 0.06 |
| IsoPar E[6] | 70.0 |

[2]PS225 is a silicone gum with randomly distributed vinyl groups along a polydimethyl siloxane main chain from United Chemical.
[3]SL6020 is a hydromethyl siloxane polymer, a product of GE Silicones.
[4]SL6040 is a volatile inhibitor product of GE Silicones.
[5]PC075 is a platinum complex from United Chemicals.
[6]IsoPar E is an isoparafin solvent from Exxon Chemical.

The partially dried coating from the whirler coater was further cured at 125° C. for 3 min. The resulting negative waterless plate was imagewise exposed through a negative original by a UV lamp for a dose of 200 mJ/cm$^2$, and then lightly wiped with a cotton pad soaked with a developer solution consisting of 50 parts ethanol and 50 parts IsoPar E. The features of negative original were reproduced with good fidelity.

Alternatively, the waterless plate of this example after UV exposure was soaked in absolute ethanol for 1 min, and then rubbed with isoPar E until silicone was completely removed from the UV exposure area. The features of negative original including 6 micron lines and 6 micron gaps were precisely reproduced on the waterless plate.

The waterless plate of this example after UV exposure was also developed by rubbing with tripropylene glycol n-butyl ether until the silicone layer and the radiation-sensitive layer in the UV exposure area were removed from the substrate. After development, the plate was immediately cleaned of residual developer with polypropylene glycol (MW 700, Aldrich Chemical).

The developed waterless plate was mounted on an OMCSA H-125 sheet-fed printing press (roberts & Porter, Inc., Italy) for a press test using a Kohl & Madden waterless ink NB97-1998 and Husky Offset paper (Weyerhaeuser Co.). More than ten thousand good-quality impressions were printed.

COMPARATIVE EXAMPLE A

This example illustrates the effect of omitting the essential polyurethane component in the light-solubilizable layer. The radiation sensitive coating in Example 1 was replaced with a 3% RP2 resin solution in 2-butanone. The silicone on the resulting plates has poor adhesion to the radiation sensitive layer and can be rubbed off easily with fingers. After exposure and development under the same condition used in Example 1, the silicone coating was destroyed both in the exposed and non-exposed areas.

EXAMPLE 2

This example illustrates the use of an alternative silicone elastomer composition in the printing plate of Example 1. The radiation sensitive coating solution of Example 1 was applied to an electrochemically roughened aluminum sheet by whirler coating followed by drying at 95° C. for 5 min. The resulting plate was coated by whirler coating a 0.5% solution of 3-aminopropyl triethoxy silane in IsoPar E. After drying at 95° C. for 5 min., the following silicone coating was applied by the same coating method:

| Component | Parts by weight |
|---|---|
| PS 345.5[7] | 10.0 |
| Ethyl triacetoxy silane | 0.5 |
| Dibutyl tin diacetate | 0.020 |
| IsoPar E | 200.0 |

[7]PS 345.5 is a silanol terminated polydimethyl siloxane obtained from United Chemicals.

The partially dried coating from the whirler coater was further cured at 125° C. The resulting negative waterless plate was imagewise exposed through a negative original by a UV lamp for a dose of 200 mJ/cm2, and then lightly wiped with a cotton pad soaked with a developer solution consisting of 50 parts ethanol and 50 parts IsoPar E. The features of negative original were reproduced with good fidelity.

EXAMPLE 3

This example illustrates the use of an alternative polyurethane in the light solubilizable layer of Example 1.

A linear polyurethane was prepared by reacting 4,4'-diphenylmethane diisocyanate and toluene-2,4-diisocyanate with 3-allyloxypropane-1,2-diol by the following procedure. In a round-bottom glass flask equipped with a condenser and a mechanical stirrer, 49.1 gram (0.196 mol) 4,4'-diphenylmethane diisocyanate (mol. wt: 250) and 34.1 gram (0.196 mol) toluene-2,4-diisocyanate (mol. wt: 174) were dispersed in 312 gram dry 2-butanone at room temperature (ca. 25° C.) until a uniform milky dispersion was obtained. Then 51.8 gram (0.393 mol) 3-allyloxypropane-1,2-diol was added to the flask at a rate such that the temperature rise due to the exotherm of the reaction was controlled below 15 degrees, viz., the temperature of the mixture was maintained below 40° C. The mixture was stirred without external heating for two hours. Then 3 gram 5% dibutyl tin dilaurate solution in dry 2-butanone was added also at a rate such that temperature rise due to exotherm of the reaction was controlled below 15 degrees, viz., the temperature of the mixture was maintained below 40° C. The mixture was stirred without external heating for two additional hours. Finally, the reaction was pushed to completion at 60° C. Completion of the reaction was indicated by the disappearance of NCO absorption bands in infrared spectra. After filtration, the product solution, hereafter identified as Polyurethane Solution (II), contained 30% polyurethane resin and was slightly hazy.

A printing plate was prepared as described in Example 1 except that Polyurethane Solution (II) was substituted for Polyurethane Solution (I) in the radiation sensitive coating composition of Example 1. The resulting plate was exposed to UV for a dose of 300 mj/cm², and developed in triproplyene glycol n-butyl ether at 35° C. The negative images of the original were reproduced with good fidelity.

EXAMPLE 4

This example illustrates a light-solublizable sublayer that contained a 20 wt % added ethanol-soluble phenolic resin.

A printing plate was prepared as described in Example 1 except that the radiation sensitive coating composition of Example 1 was replaced with the following radiation sensitive coating solution:

| Component | Parts by weight |
|---|---|
| RP2 | 1.00 |
| Polyurethane Solution (I) | 3.33 |
| SD 140A[8] | 0.50 |
| 2-butanone | 100.00 |

[8]SD 140A is a Novolac resin from Borden, Inc.

The resulting negative waterless plate was exposed to UV light through a negative original for a dose of 180 mj/cm² and then developed by rubbing with triproplyene glycol n-butyl ether at 35° C. The images of the original were reproduced with good fidelity.

EXAMPLE 5

This example illustrates the use of naphthaquinone diazide compound that is a reaction product between a corresponding sulfonyl chloride and a phenolic resin other than a Novolac resin.

A printing plate was prepared as described in Example 1 except that the radiation sensitive coating composition of Example 1 was replaced with the following radiation sensitive coating solution:

| Component | Parts by weight |
|---|---|
| SD 140A | 1.00 |
| Estane 5715[9] | 1.00 |
| P 3000[10] | 0.50 |
| 2-butanone | 100.00 |

[9]Estane 5715 is a polyurethane resin available from BFGridrich.
[10]P3000 is 22 reaction product between 1,2-naphthaquinone-5-sulfonyl chloride with an acetone condensate of pyrogallol and is available from PCAS, France.

The resulting negative waterless plate was exposed and processed as in Example 1. The images of the original were reproduced with good fidelity.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A dry planographic printing plate comprising, in the order given:
   A) a sheet substrate;
   B) a radiation sensitive imaging layer comprising a diazido naphthoquinone ester or amide compound, and a thermoplastic polyurethane containing allyl functionality; and
   C) a silicone layer comprised of a crosslinked silicone polymer.

2. The dry planographic printing plate of claim 1 wherein the thermoplastic polyurethane is prepared by reacting a di-isocyanate and a diol.

3. The dry planographic printing plate of claim 2 wherein the di-isocyanate is one or more compounds selected from the group consisting of 2,4-tolylene diisocyanate; 2,6-tolylene diisocyanate; p-xylene diisocynate; m-xylene diisocyanate; 4,4'-diphenylmethane diisocyanate; 1,5-naphthalene diisocyanate; 3,3'-dimethylbiphenyl-4,4'-diisocyanate; hexamethylene diisocyanate; trimethylhexamethylene diisocyanate; isophorone diisocyanate; 4-4'-methylenebis(cyclohexyl isocyanate); methylcyclohexane-2,4-diisocyanate; methylcyclohexane-2,6-diisocyanate; and 1,3-bis(isocyanatomethyl) cyclohexane.

4. The dry planographic printing plate of claim 2 wherein the di-isocyanate is an aryl di-isocyanate.

5. The dry planographic printing plate of claim 4 wherein the aryl di-isocyanate is one or more compounds selected from the group consisting of 2,4-tolylene diisocyanate; 2,6-tolylene diisocyanate; p-xylene diisocynate; m-xylene diisocyanate; 4,4'-diphenylmethane diisocyanate; 1,5-naphthalene diisocyanate; and 3,3'-dimethylbiphenyl-4,4'-diisocyanate.

6. The dry planographic printing plate of claim 4 wherein the aryl di-isocyanate is 4,4'-diphenylmethane diisocyanate.

7. The dry planographic printing plate of claim 2 wherein the diol is one or more compounds selected from the group consisting of 3-allyloxy-1,2-propanediol; ethylene glycol; polyethylene glycol; propylene glycol; polypropylene glycol; and neopentyl glycol.

8. The dry planographic printing plate of claim 2 wherein 70% or more of the diol is an allyl diol containing an allyl functionality.

9. The dry planographic printing plate of claim 8 wherein the allyl diol is 3-allyloxypropane-1,2-diol.

10. The dry planographic printing plate of claim 1 wherein the diazido naphthaquinone ester or amide compound is a diazido naphthoquinone sulfonate of a phenolic material.

11. The dry planographic printing plate of claim 10 wherein the phenolic material is a Novolac resin or a condensate of acetone with pyrogallol.

12. The dry planographic printing plate of claim 1 wherein the radiation sensitive imaging layer contains an ancillary phenolic resin.

13. The dry planographic printing plate of claim 1 wherein the crosslinked silicone polymer is the curing product of a vinyl functional polysiloxane copolymer and a polymer or copolymer of methyl hydrosiloxane.

14. The dry planographic printing plate of claim 1 wherein the silicone layer is further comprised of an adhesion promoter.

15. The dry planographic printing plate of claim 14 wherein the adhesion promoter is 3-aminopropyl triethoxy silane.

16. The dry planographic printing plate of claim 1 wherein the sheet substrate is an aluminum sheet.

17. The dry planographic printing plate of claim 1 wherein the dry planographic printing plate contains a primer layer between the substrate and the radiation imaging layer.

18. The dry planographic printing plate of claim 17 wherein the primer layer has an ink receptive surface.

19. The dry planographic printing plate of claim 1 wherein the dry planographic printing plate contains an adhesion promotion layer between the radiation imaging layer and the silicone layer.

20. The dry planographic printing plate of claim 19 wherein the adhesion promotion layer is a sub layer interface of the silicone layer which is located at an interface of the silicone layer and the radiation sensitive imaging layer, and wherein the sub layer contains an adhesion promoter.

21. The dry planographic printing plate of claim 1 wherein a removeable protective layer is laminated to the silicone layer.

22. A method for imaging a dry planographic printing plate comprising the steps, in the order given:
   I) providing a dry planographic printing plate comprising in the order given:
      A) a sheet substrate;
      B) a radiation sensitive imaging layer comprising a diazido naphthoquinone ester or amide compound, and a thermoplastic polyurethane containing allyl functionality; and
      C) a silicone layer comprised of a crosslinked silicone polymer;
   II) imagewise exposing the radiation sensitive imaging layer to actinic radiation to form an imaged layer having exposed areas and complimentary unexposed areas, wherein only the exposed areas of the imaged layer are soluble or dispersible in a developer liquid; and
   III) applying the developer liquid to the dry planographic printing plate to remove the exposed areas along with overlying areas of the silicone layer to produce an imaged dry planographic printing plate having uncovered ink receptive areas and complimentary ink repellent areas of the silicone layer.

23. The method for imaging a planographic printing plate of claim 22, wherein a removeable protective layer is laminated to the silicone layer and wherein the removeable protective layer is removed from the silicone layer before (III) applying the developer liquid to the planographic printing plate.

24. The method for imaging a planographic printing plate of claim 22, wherein the actinic radiation is ultraviolet radiation.

25. The method for imaging a planographic printing plate of claim 22, wherein the radiation sensitive imaging layer is imagewise exposed to the actinic radiation passing through the silicone layer.

26. The method for imaging a planographic printing plate of claim 23, wherein the removeable protective layer is transparent to the actinic radiation and wherein the radiation sensitive imaging layer is imagewise exposed to the actinic radiation passing through the removeable protective layer.

27. The method for imaging a planographic printing plate of claim 22, wherein the radiation sensitive imaging layer is imagewise exposed to the actinic radiation passing through a contact or projection negative film element.

28. The method for imaging a planographic printing plate of claim 22, wherein the developer liquid comprises a propyleneglycol ether.

29. The method for imaging a planographic printing plate of claim 28, wherein the propyleneglycol ether is tripropyleneglycol-n-butyl ether.

30. The method for imaging a planographic printing plate of claim 28, wherein the developer liquid is diluted with a non-developing liquid.

31. The method for imaging a planographic printing plate of claim 30, wherein the non-developer liquid is polypropylene glycol, aliphatic hydrocarbon solvents, or a combination thereof.

32. The method for imaging a planographic printing plate of claim 22, wherein the developer liquid is applied to the planographic printing plate by wiping or rubbing the silicone layer with an applicator containing the developer liquid.

33. The method for imaging a planographic printing plate of claim 22, wherein the developer liquid is applied to the planographic printing plate by spraying the silicone layer with the developer liquid.

34. The method for imaging a planographic printing plate of claim 22, wherein the developer liquid is applied to the planographic printing plate by soaking the planographic printing plate in the developer liquid and then wiping or rubbing the silicone layer with an applicator containing a non-developer liquid.

35. The method for imaging a planographic printing plate of claim 34, wherein the developer liquid is a mixture of ethanol and a hydrocarbon solvent; and wherein the nondeveloping liquid is a hydrocarbon solvent, mineral oil, vegitable oil, or a combination thereof.

36. The method for imaging a planographic printing plate of claim 22, wherein after step (III) the imaged planographic printing plate is cleaned by applying a non-developing cleaning liquid to the uncovered ink receptive areas and complimentary ink repellent areas.

37. The method for imaging a planographic printing plate of claim 36, wherein the non-developing cleaning liquid is an aqueous surfactant solution, a polypropylene glycol, or a hydrocarbon solvent.

38. A method for dry planographic printing consisting essentially of the steps, in the order given:

I) providing a dry planographic printing plate comprising in the order given:
   A) a sheet substrate;
   B) a radiation sensitive imaging layer comprising a diazido naphthoquinone ester or amide compound, and a thermoplastic polyurethane containing allyl functionality; and
   C) a silicone layer comprised of a crosslinked silicone polymer;

II) imagewise exposing the radiation sensitive imaging layer to actinic radiation to form an imaged layer having exposed areas and complimentary unexposed areas, wherein only the exposed areas of the imaged layer are soluble or dispersible in a developer liquid; and III) applying the developer liquid to the dry planographic printing plate to remove the exposed areas along with overlying areas of the silicone layer to produce an imaged planographic printing plate having uncovered ink receptive areas and complimentary ink repellent areas of the silicone layer;

IV) mounting the imaged planographic printing plate on a dry planographic printing press which is free of a fountain solution and contains a lithographic ink; and V) printing print stock to produce printed stock therefrom.

39. The method for imaging a planographic printing plate of claim 38, wherein the lithographic ink is an oil based ink.

40. A dry planographic printing plate comprising, in the order given:
A) a sheet substrate;
B) a radiation sensitive imaging layer comprising a novolak resin, a diazido naphthoquinone sulfonate of a condensate of acetone with pyrogallol, and a thermoplastic polyurethane; and
C) a silicone layer comprised of a crosslinked silicone polymer.

41. A method for imaging a dry planographic printing plate comprising the steps, in the order given:

I) providing a dry planographic printing plate comprising in the order given:
   A) a sheet substrate;
   B) a radiation sensitive imaging layer comprising a novolak resin, a diazido naphthoquinone sulfonate of a condensate of acetone with pyrogallol, and a thermoplastic polyurethane; and
   C) a silicone layer comprised of a crosslinked silicone polymer;

II) imagewise exposing the radiation sensitive imaging layer to actinic radiation to form an imaged layer having exposed areas and complimentary unexposed areas, wherein only the exposed areas of the imaged layer are soluble or dispersible in a developer liquid; and III) applying the developer liquid to the dry planographic printing plate to remove the exposed areas along with overlying areas of the silicone layer to produce an image dry planographic printing plate having uncovered ink receptive areas and complimentary ink repellent areas of the silicone layer.

* * * * *